United States Patent
Huang

(10) Patent No.: US 10,825,371 B2
(45) Date of Patent: Nov. 3, 2020

(54) SHIFT REGISTER, GATE DRIVING CIRCUIT, DISPLAY PANEL AND DRIVING METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 389 days.

(21) Appl. No.: 15/775,943

(22) PCT Filed: Sep. 21, 2017

(86) PCT No.: PCT/CN2017/102541
§ 371 (c)(1),
(2) Date: May 14, 2018

(87) PCT Pub. No.: WO2018/161527
PCT Pub. Date: Sep. 13, 2018

(65) Prior Publication Data
US 2020/0302844 A1    Sep. 24, 2020

(30) Foreign Application Priority Data

Mar. 8, 2017 (CN) .......................... 2017 1 0135048

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC .. G09G 3/20; G09G 2310/0286; G11C 19/00; G11C 19/28
See application file for complete search history.

(56) References Cited

U.S. PATENT DOCUMENTS 9,824,659 B2 * 11/2017 Gu ........................ G09G 3/3677
2010/0134234 A1    6/2010 Liao et al.
2014/0119493 A1    5/2014 Yang et al.

FOREIGN PATENT DOCUMENTS

CN    102945650 A    2/2013
CN    105096904 A    11/2015
(Continued)

OTHER PUBLICATIONS

International Search Report and Written Opinion dated Dec. 27, 2017; PCT/CN2017/102541.

*Primary Examiner* — Sardis F Azongha

(57) ABSTRACT

A shift register, a gate driving circuit, a display panel and a driving method. The shift register includes an input circuit, an output circuit, a pull-up node pull-down circuit, a first pull-down circuit of a first pull-down node, an output pull-down circuit, a pull-up circuit of the first pull-down node and a filter circuit. The filter circuit is connected with the first pull-down node, a second pull-down node, a first power terminal and a second power terminal respectively, and is configured to filter a voltage of the first pull-down node and transmit the filtered voltage to the second pull-down node.

20 Claims, 7 Drawing Sheets

(52) U.S. Cl.
CPC . *G09G 2300/08* (2013.01); *G09G 2310/0267* (2013.01); *G09G 2310/0286* (2013.01); *G09G 2310/08* (2013.01)

(56) References Cited

FOREIGN PATENT DOCUMENTS

| | | |
|---|---|---|
| CN | 106228927 A | 12/2016 |
| CN | 106297697 A | 1/2017 |
| CN | 106601181 A | 4/2017 |

\* cited by examiner

SHIFT REGISTER, GATE DRIVING CIRCUIT, DISPLAY PANEL AND DRIVING METHOD

TECHNICAL FIELD

Embodiments of the present disclosure relate to a shift register, a gate driving circuit, a display panel and a driving method.

BACKGROUND

With the rapid development of display technology, display panels are increasingly developed toward a direction of high integration and low cost. A gate-driver on array (GOA) substrate technology is a technology of directly integrating a gate driving circuit on an array substrate of a display device through a photolithography process. A GOA circuit typically includes a plurality of cascaded shift registers, each shift register is connected to a gate line corresponding to a row of pixels (for example, each shift register provides a scan driving signal to a gate line connected to a row of pixels) to achieve scan driving of a display panel. This integrated technology can save spaces of a bonding area and a fan-out area of a gate integrated circuit, so as to achieve a narrow frame of the display panel, and meanwhile, production costs can be reduced and production yields can be improved.

Reliability of a GOA directly affects reliability of the display panel, and therefore, how to improve the reliability of the GOA has also become one of the research focuses.

SUMMARY

An embodiment of the present disclosure provides a shift register, which comprises: an input circuit, connected with a pull-up node, and configured to write a first input signal into the pull-up node; an output circuit, connected with the pull-up node and an output terminal respectively, and configured to write a first clock signal into the output terminal; a pull-up node pull-down circuit, connected with the pull-up node, a first pull-down node, and a first power terminal respectively; a first pull-down circuit of the first pull-down node, connected with the first pull-down node, the pull-up node and the first power terminal respectively; an output pull-down circuit, connected with the output terminal, a second pull-down node and the first power terminal respectively; a pull-up circuit of the first pull-down node, configured to pull up a voltage of the first pull-down node in response to a second clock signal and/or a reset control signal; and a filter circuit, connected with the first pull-down node, the second pull-down node, the first power terminal and a second power terminal respectively, and configured to filter the voltage of the first pull-down node and transmit the filtered voltage to the second pull-down node.

For example, the shift register further comprises: a reset circuit, connected with the pull-up node, and configured to write a second input signal into the pull-up node; and a first storage circuit, connected with the pull-up node and the output terminal respectively.

For example, in the shift register provided by an embodiment of the present disclosure, the input circuit comprises a first transistor, a first electrode of the first transistor is connected with a first input signal terminal to receive the first input signal, a gate electrode of the first transistor is connected with an input control terminal to receive an input control signal, and a second electrode of the first transistor is connected with the pull-up node; the reset circuit comprises a second transistor, a first electrode of the second transistor is connected with a second input signal terminal to receive the second input signal, a gate electrode of the second transistor is connected with a reset control terminal to receive the reset control signal, and a second electrode of the second transistor is connected with the pull-up node; the output circuit comprises a third transistor, a first electrode of the third transistor is connected with a first clock signal terminal to receive the first clock signal, a gate electrode of the third transistor is connected with the pull-up node, a second electrode of the third transistor is connected with the output terminal; and the first storage circuit comprises a first capacitor, a first terminal of the first capacitor is connected with the pull-up node, and a second terminal of the first capacitor is connected with the output terminal.

For example, in the shift register provided by an embodiment of the present disclosure, the pull-up node pull-down circuit comprises a fourth transistor, a first electrode of the fourth transistor is connected with the pull-up node, a gate electrode of the fourth transistor is connected with the first pull-down node, and a second electrode of the fourth transistor is connected with the first power terminal to receive a first power voltage.

For example, in the shift register provided by an embodiment of the present disclosure, the first pull-down circuit of the first pull-down node comprises a fifth transistor, a first electrode of the fifth transistor is connected with the first pull-down node, a gate electrode of the fifth transistor is connected with the pull-up node, and a second electrode of the fifth transistor is connected with the first power terminal to receive the first power voltage.

For example, in the shift register provided by an embodiment of the present disclosure, the output pull-down circuit comprises a sixth transistor, a first electrode of the sixth transistor is connected with the output terminal, a gate electrode of the sixth transistor is connected with the second pull-down node, and a second electrode of the sixth transistor is connected with the first power terminal to receive the first power voltage.

For example, in the shift register provided by an embodiment of the present disclosure, the pull-up circuit of the first pull-down node comprises a seventh transistor and an eighth transistor, a first electrode of the seventh transistor is connected with a second clock signal terminal to receive the second clock signal, a gate electrode of the seventh transistor is connected with the second clock signal terminal to receive the second clock signal, a second electrode of the seventh transistor is connected with the first pull-down node, a first electrode of the eighth transistor is connected with the second power terminal to receive a second power voltage, a gate electrode of the eighth transistor is connected with the reset control terminal to receive the reset control signal, and a second electrode of the eighth transistor is connected with the first pull-down node.

For example, the shift register provided by an embodiment of the present disclosure further comprises a second pull-down circuit of the first pull-down node, the second pull-down circuit of the first pull-down node comprises a ninth transistor, a first electrode of the ninth transistor is connected with the first pull-down node, a gate electrode of the ninth transistor is connected with the output terminal, and a second electrode of the ninth transistor is connected with the first power terminal to receive the first power voltage.

For example, the shift register provided by an embodiment of the present disclosure further comprises a tenth transistor, a first electrode of the tenth transistor is connected with the input circuit, the reset circuit and the pull-up node pull-down circuit respectively, a gate electrode of the tenth transistor is connected with the second power terminal to receive the second power voltage, and a second electrode of the tenth transistor is connected with the first storage circuit, the output circuit and the first pull-down circuit of the first pull-down node respectively.

For example, the shift register provided by an embodiment of the present disclosure further comprises a second storage circuit and a third storage circuit, the second storage circuit is connected with the pull-up node and the first power terminal respectively, and is configured to maintain a voltage difference between the pull-up node and the first power terminal, the third storage circuit is connected with the second pull-down node and the first power terminal respectively, and is configured to maintain a voltage difference between the second pull-down node and the first power terminal, the second storage circuit comprises a second capacitor, a first terminal of the second capacitor is connected with the pull-up node, a second terminal of the second capacitor is connected with the first power terminal, the third storage circuit comprises a third capacitor, a first terminal of the third capacitor is connected with the second pull-down node, and a second terminal of the third capacitor is connected with the first power terminal.

For example, in the shift register provided by an embodiment of the present disclosure, the filter circuit comprises a first filter transistor, a second filter transistor, a third filter transistor, a fourth filter transistor, a fifth filter transistor, a sixth filter transistor, a seventh filter transistor, an eighth filter transistor, a ninth filter transistor, a tenth filter transistor, an eleventh filter transistor, and a twelfth filter transistor, the first filter transistor, the second filter transistor, the fifth filter transistor, the seventh filter transistor, the eighth filter transistor, and the eleventh filter transistor all are P-type transistors, the third filter transistor, the fourth filter transistor, the sixth filter transistor, the ninth filter transistor, the tenth filter transistor, and the twelfth filter transistor all are N-type transistors, a first electrode of the first filter transistor is connected with the second power terminal to receive the second power voltage, a gate electrode of the first filter transistor is connected with the first pull-down node, a second electrode of the first filter transistor is connected with a first node, a first electrode of the second filter transistor is connected with the first node, a gate electrode of the second filter transistor is connected with the first pull-down node, a second electrode of the second filter transistor is connected with a second node, a first electrode of the third filter transistor is connected with the second node, a gate electrode of the third filter transistor is connected with the first pull-down node, a second electrode of the third filter transistor is connected with a third node, a first electrode of the fourth filter transistor is connected with the third node, a gate electrode of the fourth filter transistor is connected with the first pull-down node, a second electrode of the fourth filter transistor is connected with the first power terminal to receive the first power voltage, a first electrode of the fifth filter transistor is connected with the first node, a gate electrode of the fifth filter transistor is connected with the second node, a second electrode of the fifth filter transistor is connected with the first power terminal to receive the first power voltage, a first electrode of the sixth filter transistor is connected with the third node, a gate electrode of the sixth filter transistor is connected with the second node, a second electrode of the sixth filter transistor is connected with the second power terminal to receive the second power voltage, a first electrode of the seventh filter transistor is connected with the second power terminal to receive the second power voltage, a gate electrode of the seventh filter transistor is connected with the second node, a second electrode of the seventh filter transistor is connected with a fourth node, a first electrode of the eighth filter transistor is connected with the fourth node, a gate electrode of the eighth filter transistor is connected with the second node, a second electrode of the eighth filter transistor is connected with the second pull-down node, a first electrode of the ninth filter transistor is connected with the second pull-down node, a gate electrode of the ninth filter transistor is connected with the second node, a second electrode of the ninth filter transistor is connected with a fifth node, a first electrode of the tenth filter transistor is connected with the fifth node, a gate electrode of the tenth filter transistor is connected with the second node, a second electrode of the tenth filter transistor is connected with the first power terminal to receive the first power voltage, a first electrode of the eleventh filter transistor is connected with the fourth node, a gate electrode of the eleventh filter transistor is connected with the second pull-down node, a second electrode of the eleventh filter transistor is connected with the first power terminal to receive the first power voltage, a first electrode of the twelfth filter transistor is connected with the fifth node, a gate electrode of the twelfth filter transistor is connected with the second pull-down node, and a second electrode of the twelfth filter transistor is connected with the second voltage terminal to receive the second power voltage.

For example, in the shift register provided by an embodiment of the present disclosure, the filter circuit comprises a first filter transistor, a second filter transistor, a third filter transistor, and a fourth filter transistor, the first filter transistor and the third filter transistor are P-type transistors, the second filter transistor and the fourth filter transistor are N-type transistors, a first electrode of the first filter transistor is connected with the second power terminal to receive the second power voltage, a gate electrode of the first filter transistor is connected with the first pull-down node, a second electrode of the first filter transistor is connected with a sixth node, a first electrode of the second filter transistor is connected with the sixth node, a gate electrode of the second filter transistor is connected with the first pull-down node, a second electrode of the second filter transistor is connected with the first power terminal to receive the first power voltage, a first electrode of the third filter transistor is connected with the second power terminal to receive the second power voltage, a gate electrode of the third filter transistor is connected with the sixth node, a second electrode of the third filter transistor is connected with the second pull-down node, a first electrode of the fourth filter transistor is connected with the second pull-down node, a gate electrode of the fourth filter transistor is connected with the sixth node, and a second electrode of the fourth filter transistor is connected with the first power terminal to receive the first power voltage.

An embodiment of the present disclosure further provides a gate driving circuit, comprising a shift register provided by any one of the embodiments of the present disclosure.

For example, the gate driving circuit provided by an embodiment of the present disclosure comprises a plurality of cascaded shift registers provided by any one embodiment of the present disclosure. Except for a first-stage shift register and a last-stage shift register, an input control terminal of a present-stage shift register is connected with an output terminal of a previous-stage shift register; a reset control terminal of the present-stage shift register is connected with an output terminal of a next-stage shift register.

An embodiment of the present disclosure further provides a display panel, comprising a gate driving circuit provided by any one embodiment of the present disclosure.

An embodiment of the present disclosure further provides a driving method of a shift register provided by any one embodiment of the present disclosure, comprising: filtering a voltage of a first pull-down node by a filter circuit; and transmitting the filtered voltage to a second pull-down node.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
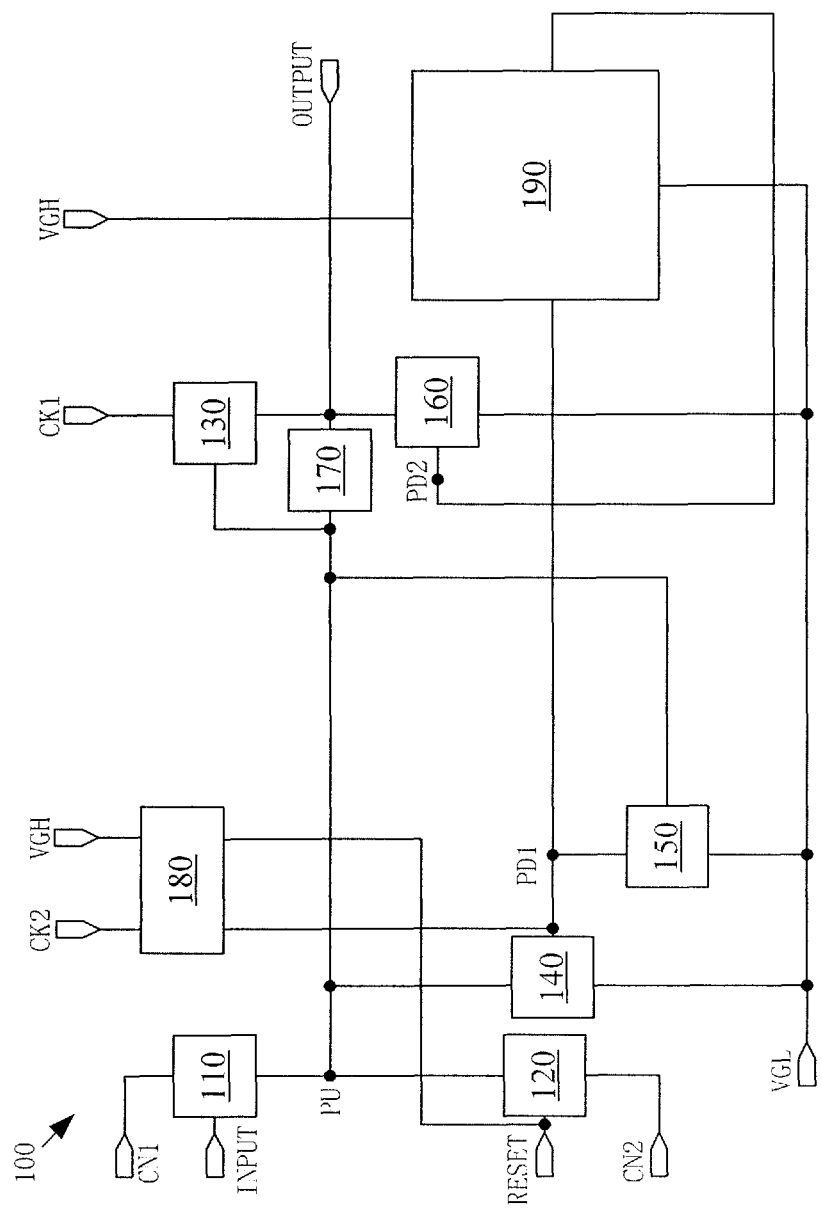
FIG. 1 is a first schematic diagram of a shift register provided by an embodiment of the present disclosure.

The technical solutions of the embodiments will be described in a clearly and fully understandable way below in connection with the accompanying drawings. With reference to the non-limiting exemplary embodiments illustrated in the accompanying drawings and detailed in the following description, the exemplary embodiments of the present disclosure and their various features and advantageous details are more fully described. It should be noted that, the features shown in figures are not necessarily to be drawn in a real scale. The description of the known material(s), component(s) and process technology can be omitted in the present disclosure, so that the exemplary embodiments of the present disclosure are not obscured. The examples provided are merely intended to be beneficial for understanding the implementation of the exemplary embodiments of the present disclosure, and further enable one of ordinary skill in the art to implement the exemplary embodiments. Therefore, the examples should not be construed as a limitation of the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. In addition, in respective embodiments of the present disclosure, the same or similar reference numerals denote the same or similar components.

Embodiments of the present disclosure provide a shift register, a gate driving circuit, a display panel and a driving method, which can reduce noise of the shift register and improve stability of the shift register.

An embodiment of the present disclosure provides a shift register 100. As shown in FIG. 1, the shift register 100 comprises an input circuit 110, a reset circuit 120, an output circuit 130, a pull-up node pull-down circuit 140, a first pull-down circuit 150 of a first pull-down node, an output pull-down circuit 160, a first storage circuit 170, a pull-up circuit 180 of the first pull-down node and a filter circuit 190.

For example, the input circuit 110 is connected with a pull-up node PU, and is configured to write a first input signal CN1 into the pull-up node PU. For another example, the input circuit 110 is connected with the pull-up node PU, an input control terminal (the input control terminal is configured to provide an input control signal INPUT) and a first input signal terminal (the first input signal terminal is configured to provide the first input signal CN1) respectively; the input circuit 110 is configured to transmit the first input signal CN1 to the pull-up node PU in response to the input control signal INPUT controlling the input circuit 110 to be turned on (that is, under the control of the input control signal INPUT, one terminal of the input circuit 110 that is connected with the first input signal CN1 and another terminal of the input circuit 110 that is connected with the pull-up node PU conduct with each other).

For example, the reset circuit 120 is connected with the pull-up node PU and is configured to write a second input signal CN2 into the pull-up node PU. For another example, the reset circuit 120 is connected with the pull-up node PU, a reset control terminal (the reset control terminal is configured to provide a reset control signal RESET) and a second input signal terminal (the second input signal terminal is configured to provide the second input signal CN2) respectively. The reset circuit 120 is configured to write the second input signal CN2 into the pull-up node PU in response to the reset control signal controlling the reset circuit 120 to be turned on (that is, under the control of the reset control signal RESET, one terminal of the reset circuit 120 connected with the second input signal CN2 and another terminal of the reset circuit 120 connected with the pull-up node PU conduct with each other).

For example, the output circuit 130 is connected with the pull-up node PU and an output terminal OUTPUT respectively, and is configured to write a first clock signal CK1 into the output terminal OUTPUT. For another example, the output circuit 130 is connected with the pull-up node PU, the output terminal OUTPUT and a first clock signal terminal (the first clock signal terminal is configured to provide the first clock signal CK1) respectively. The output circuit 130 is configured to write the first clock signal CK1 into the output terminal OUTPUT when a voltage of the pull-up node PU is a voltage that can make the output circuit 130 to be conducted. For example, when the voltage of the pull-up node PU enables that one terminal of the output circuit 130 connected with the first clock signal CK1 and another terminal of the output circuit 130 connected with the output terminal OUTPUT conduct with each other, the output circuit 130 transmits the first clock signal CK1 to the output terminal OUTPUT.

For example, the pull-up node pull-down circuit 140 is connected with the pull-up node PU, a first pull-down node PD1 and a first power terminal respectively. For example, the first power terminal is configured to provide a first power voltage VGL. For another example, the pull-up node pull-down circuit 140 is configured to write the first power voltage VGL into the pull-up node PU when a voltage of the first pull-down node PD1 is a voltage that can conduct the pull-up node pull-down circuit 140.

For example, the first pull-down circuit 150 of the first pull-down node is connected with the first pull-down node PD1, the pull-up node PU and the first power terminal respectively. For another example, the first pull-down circuit 150 of the first pull-down node is configured to write the first power voltage VGL into the first pull-down node PD1 when the voltage of the pull-up node PU is a voltage that can conduct the first pull-down circuit 150 of the first pull-down node.

For example, the output pull-down circuit 160 is connected with the output terminal OUTPUT, a second pull-down node PD2 and the first power terminal respectively. For another example, the output pull-down circuit 160 is configured to write the first power voltage VGL into the output terminal OUTPUT when a voltage of the second pull-down node PD2 is a voltage that can conduct the output pull-down circuit 160.

For example, the first storage circuit 170 is connected with the pull-up node PU and the output terminal OUTPUT respectively. For another example, the first storage circuit 170 is configured to storage electric charges to maintain a voltage difference between the pull-up node PU and the output terminal OUTPUT.

For example, the pull-up circuit 180 of the first pull-down node is configure to pull up a voltage of the first pull-down node PD1 in response to a second clock signal CK2 and/or the reset control signal RESET. For another example, the pull-up circuit 180 of the first pull-down node is configure to: when the second clock signal CK2 and/or the reset control signal RESET cause at least part of sub-circuits of the pull-up circuit 180 of the first pull-down node to be turned on, write a second power voltage VGH into the first pull-down PD1, that is, to pull up the voltage of the first pull-down PD1.

For example, the filter circuit 190 is connected with the first pull-down PD1, the second pull-down PD2, the first power terminal and a second power terminal respectively. The second power terminal is configure to provide the second power voltage VGH. The filter circuit 190 is configured to filter the voltage of the first pull-down node PD1 and transmit the filtered voltage to the second pull-down node PD2.

For example, the first power voltage VGL is a low level voltage (for example, 0V, 1V or other voltages); the second power voltage VGH is a high level voltage (for example, 5V, 10V or other voltages). It should be noted that, the low level voltage and the high level voltage are relative, and the low level voltage is less than the high level voltage. In different embodiments, the values of the high level voltage may be different, and the values of the low level voltage may also be different.

Figure 2:
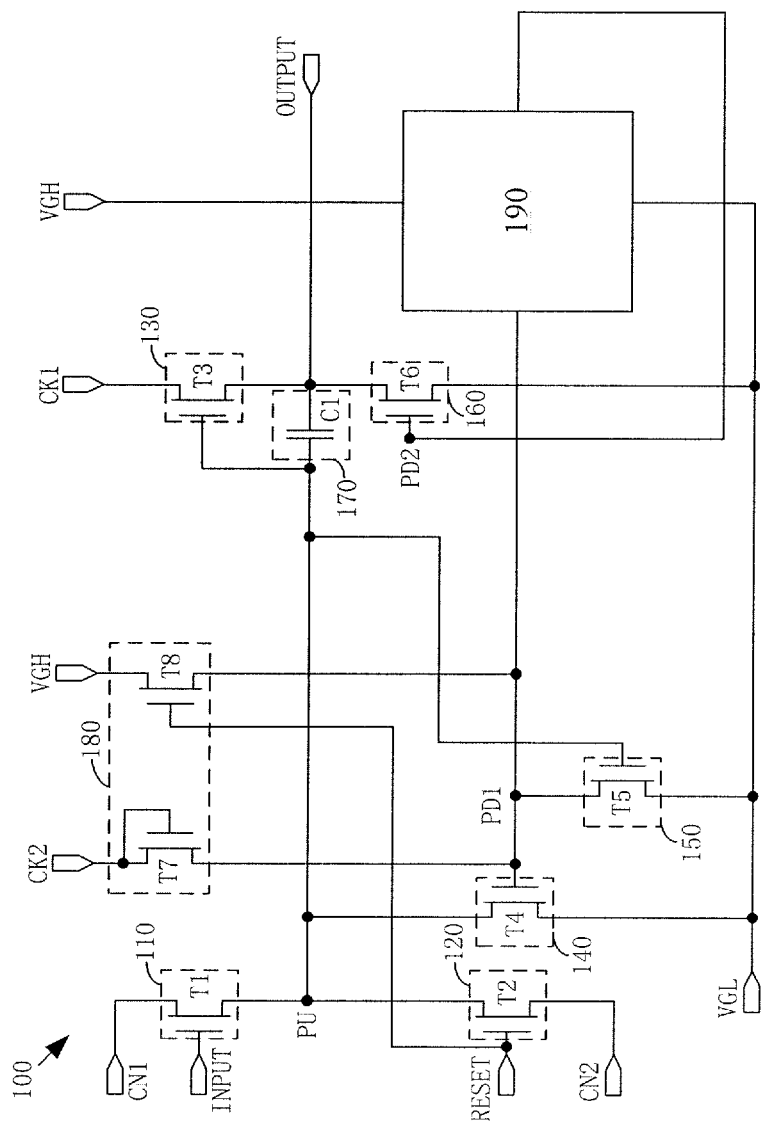
FIG. 2 is a second schematic diagram of a shift register provided by an embodiment of the present disclosure.

For example, as shown in FIG. 2, in the shift register 100 provided by an embodiment of the present disclosure, the input circuit 100 comprises a first transistor T1. A first electrode of the first transistor T1 is connected with a first input signal terminal to receive the first input signal CN1, a gate electrode of the first transistor T1 is connected with an input control terminal to receive the input control signal INPUT, and a second electrode of the first transistor T1 is connected with the pull-up node PU.

For example, as shown in FIG. 2, the reset circuit 120 comprises a second transistor T2. A first electrode of the second transistor T2 is connected with a second input signal terminal to receive the second input signal CN2, a gate electrode of the second transistor T2 is connected with a reset control terminal to receive the reset control signal RESET, and a second electrode of the second transistor T2 is connected with the pull-up node PU.

For example, as shown in FIG. 2, the output circuit 130 comprises a third transistor T3. A first electrode of the third transistor T3 is connected with a first clock signal terminal to receive the first clock signal CK1, a gate electrode of the third transistor T3 is connected with the pull-up node PU, and a second electrode of the third transistor T3 is connected with the output terminal OUTPUT.

For example, as shown in FIG. 2, the first storage circuit 170 comprises a first capacitor C1. A first terminal of the first capacitor C1 is connected with the pull-up node PU, and a second terminal of the first capacitor C1 is connected with the output terminal OUTPUT.

For example, as shown in FIG. 2, in the shift register 100 provided by an embodiment of the present disclosure, the pull-up node pull-down circuit 140 comprises a fourth transistor T4. A first electrode of the fourth transistor T4 is connected with the pull-up node PU, a gate electrode of the fourth transistor T4 is connected with the first pull-down node PD1, and a second electrode of the fourth transistor T4 is connected with the first power terminal to receive the first power voltage VGL.

For example, as shown in FIG. 2, in the shift register 100 provided by an embodiment of the present disclosure, the first pull-down circuit 150 of the first pull-down node comprises a fifth transistor T5. A first electrode of the fifth transistor T5 is connected with the first pull-down node PD1, a gate electrode of the fifth transistor T5 is connected with the pull-up node PU, and a second electrode of the fifth transistor T5 is connected with the first power terminal to receive the first power voltage VGL.

For example, as shown in FIG. 2, in the shift register 100 provided by an embodiment of the present disclosure, the output pull-down circuit 160 comprises a sixth transistor T6. A first electrode of the sixth transistor T6 is connected with the output terminal OUTPUT, a gate electrode of the sixth transistor T6 is connected with the second pull-down node PD2, and a second electrode of the sixth transistor T6 is connected with the first power terminal to receive the first power voltage VGL.

For example, as shown in FIG. 2, in the shift register 100 provided by an embodiment of the present disclosure, the pull-up circuit 180 of the first pull-down node comprises a seventh transistor T7 and an eighth transistor T8. A first electrode of the seventh transistor T7 is connected with a second clock signal terminal to receive the second clock signal CK2, a gate electrode of the seventh transistor T7 is connected with the second clock signal terminal to receive the second clock signal CK2, and a second electrode of the seventh transistor T7 is connected with the first pull-down node PD1. A first electrode of the eighth transistor T8 is connected with the second power terminal to receive the second power voltage VGH, a gate electrode of the eighth transistor T8 is connected with the reset control terminal to receive the reset control signal RESET, and a second electrode of the eighth transistor T8 is connected with the first pull-down node PD1.

It should be noted that, the pull-up circuit 180 of the first pull-down node may comprise only one of the seventh transistor T7 and the eighth transistor T8, to achieve pulling up the voltage of the first pull-down node PD1. For example, when the second clock signal CK2 is at a high level, the seventh transistor T7 is turned on, and the high-level second clock signal CK2 is written into the first pull-down node PD1. For example, when the reset control signal RESET is at a high level, the eighth transistor T8 is turned on, and the high-level second power voltage VGH is written into the first pull-down node PD1. Certainly, the pull-up circuit 180 of the first pull-down node may also comprise both the seventh transistor T7 and the eighth transistor T8 at the same time. The present disclosure is not limited thereto.

Figure 3:
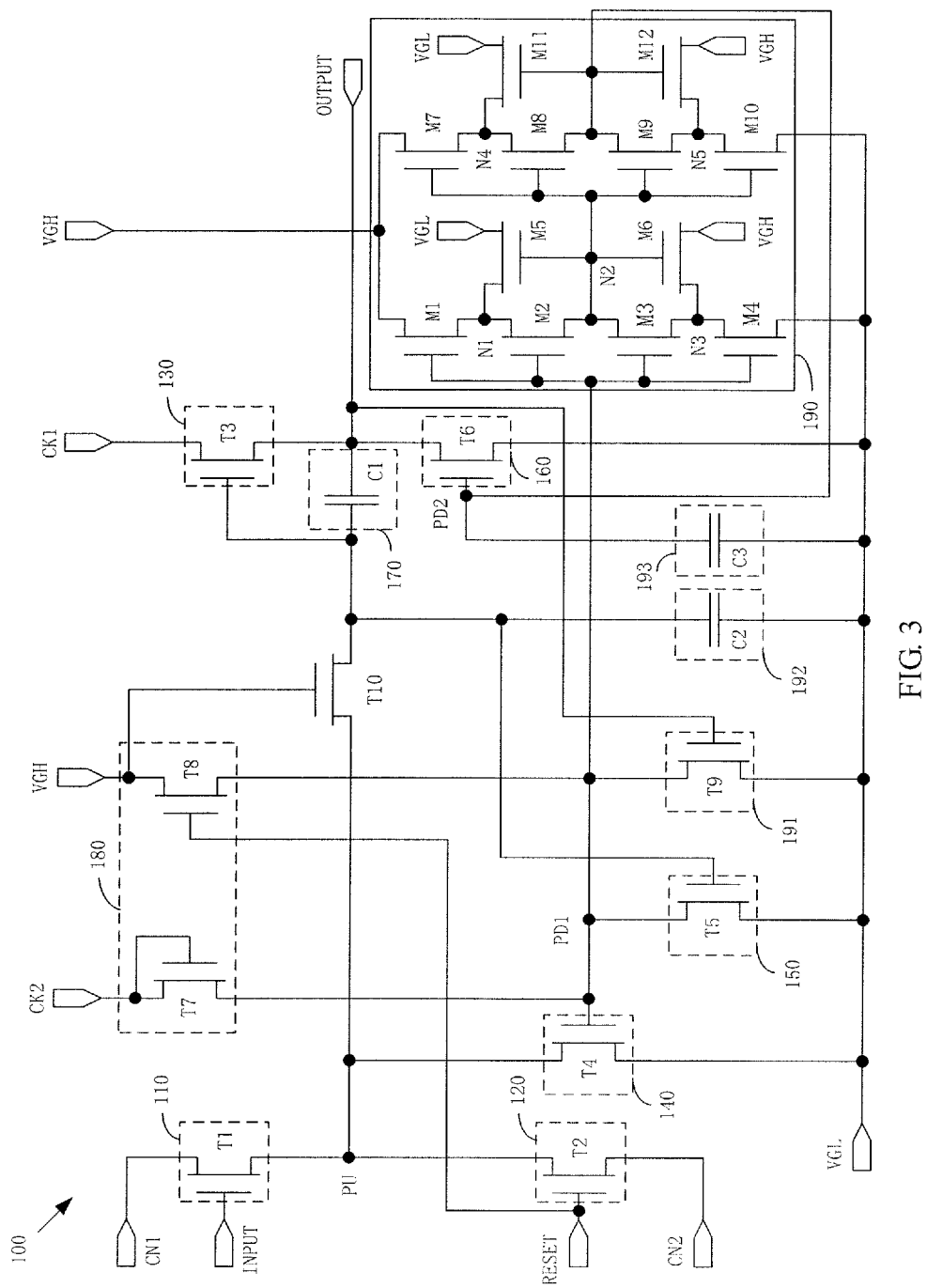
FIG. 3 is a third schematic diagram of a shift register provided by an embodiment of the present disclosure.

For example, as shown in FIG. 3, the shift register 100 provided by an embodiment of the present disclosure may further comprise a second pull-down circuit 191 of the first pull-down node. The second pull-down circuit 191 of the first pull-down node comprises a ninth transistor T9. A first electrode of the ninth transistor T9 is connected with the first pull-down node PD1, a gate electrode of the ninth transistor T9 is connected with the output terminal OUTPUT, and a second electrode of the ninth transistor T9 is connected with the first power terminal to receive the first power voltage VGL. For example, the second pull-down circuit 191 of the first pull-down node may write the first power voltage VGL into the first pull-down node PD1 in response to a high level voltage of the output terminal OUTPUT. For example, the second pull-down circuit 191 of the first pull-down node may cooperate with the first pull-down circuit 150 of the first pull-down node to pull down the voltage of the first pull-down node PD1, so as to improve the stability of the shift register.

For example, as shown in FIG. 3, the shift register 100 provided by an embodiment of the present disclosure may further comprise a tenth transistor T10. A first electrode of the tenth transistor T10 is connected with the input circuit 110, the reset circuit 120 and the pull-up node pull-down circuit 140 respectively; a gate electrode of the tenth transistor T10 is connected with the second power terminal to receive the second power voltage VGH; and a second electrode of the tenth transistor T10 is connected with the first storage circuit 170, the output circuit 130 and the first pull-down circuit 150 of the first pull-down node respectively. For example, the tenth transistor T10 is in an always turn-on state. For another example, the first electrode of the tenth transistor T10 is connected with the first transistor T1, the second transistor T2 and the fourth transistor T4, and the second electrode of the tenth transistor T10 is connected with the third transistor T3, the fifth transistor T5 and the first capacitor C1. For example, setting the tenth transistor T10 can improve the stability of the shift register.

For example, as shown in FIG. 3, the shift register 100 provided by an embodiment of the present disclosure may further comprise a second storage circuit 192 and a third storage circuit 193. The second storage circuit 192 is connected with the pull-up node PU and the first power terminal respectively, and is configured to maintain a voltage difference between the pull-up node PU and the first power terminal. The third storage circuit 193 is connected with the second pull-down node PD2 and the first power terminal respectively, and is configured to maintain a voltage difference between the second pull-down node PD2 and the first power terminal. For example, setting the second storage circuit 192 and the third storage circuit 193 can filter out clutters of the voltage of the pull-up node PU and clutters of the voltage of the second pull-down node PD2 correspondingly, and improve the stability of the shift register.

For example, as shown in FIG. 3, the second storage circuit 192 comprises a second capacitor C2. A first terminal of the second capacitor C2 is connected with the pull-up node PU (such as, the tenth transistor T10 is in a turn-on state, the first terminal of the second capacitor C2 is connected with the pull-up node PU through the tenth transistor T10), and a second terminal of the second capacitor C2 is connected with the first power terminal. The third storage circuit 193 comprises a third capacitor C3. A first terminal of the third capacitor C3 is connected with the second pull-down node PD2, and a second terminal of the third capacitor C3 is connected with the first power terminal.

It should be noted that, transistors used in the embodiments of the present disclosure may be thin film transistors, field effect transistors or other switching devices with like characteristics. A source electrode and a drain electrode of a transistor used herein may be symmetrical in structure, so that the source electrode and the drain electrode of the transistor may have no difference in structure. In the embodiments of the present disclosure, in order to distinguish two electrodes of the transistor besides a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as needed. For example, the first electrode of the transistor described in the embodiments of the present disclosure may be the source electrode, and the second electrode may be the drain electrode; alternatively, the first electrode of the transistor may be the drain electrode, and the second electrode may be the source electrode. In addition, the transistors may be classified into N-type transistors and P-type transistors according to the characteristics of the transistors. When a transistor is a P-type transistor, a turn-on voltage is a low level voltage (such as, 0V, −5V, or other suitable values), and a turn-off voltage is a high level voltage (such as, 5V, 10V, or other suitable values); when the transistor is an N-type transistor, a turn-on voltage is a high level voltage (such as, 5V, 10V, or other suitable values), and a turn-off voltage is a low level voltage (such as, 0V, −5V, or other suitable values). In the embodiments of the present disclosure, the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10 all are N-type transistors, which is taken as an example to describe the embodiments of the present disclosure. Based on the description and teaching of this implementation of the present disclosure, without any inventive work, a person of ordinary skill in the art can easily think of implementations when the embodiments of the present disclosure can adopt the P-type transistors or a combination of the N-type transistors and the P-type transistors, and therefore, these implementations are also within the protection scope of the present disclosure.

For example, in an example, as shown in FIG. 3, the filter circuit 190 comprises a first filter transistor M1, a second filter transistor M2, a third filter transistor M3, a fourth filter transistor M4, a fifth filter transistor M5, a sixth filter transistor M6, a seventh filter transistor M7, an eighth filter transistor M8, a ninth filter transistor M9, a tenth filter transistor M10, an eleventh filter transistor M11, and a twelfth filter transistor M12. For example, the first filter transistor M1, the second filter transistor M2, the fifth filter transistor M5, the seventh filter transistor M7, the eighth filter transistor M8, and the eleventh filter transistor M11 all are P-type transistors; and the third filter transistor M3, the fourth filter transistor M4, the sixth filter transistor M6, the ninth filter transistor M9, the tenth filter transistor M10, and the twelfth filter transistor M12 all are N-type transistors.

For example, a first electrode of the first filter transistor M1 is connected with the second power terminal to receive the second power voltage VGH, a gate electrode of the first filter transistor M1 is connected with the first pull-down node PD1, and a second electrode of the first filter transistor M1 is connected with a first node N1. A first electrode of the second filter transistor M2 is connected with the first node N1, a gate electrode of the second filter transistor M2 is connected with the first pull-down node PD1, and a second electrode of the second filter transistor M2 is connected with a second node N2. A first electrode of the third filter transistor M3 is connected with the second node N2, a gate electrode of the third filter transistor M3 is connected with the first pull-down node PD1, and a second electrode of the third filter transistor M3 is connected with a third node N3. A first electrode of the fourth filter transistor M4 is connected with the third node N3, a gate electrode of the fourth filter transistor M4 is connected with the first pull-down node PD1, and a second electrode of the fourth filter transistor M4 is connected with the first power terminal to receive the first power voltage VGL. A first electrode of the fifth filter transistor M5 is connected with the first node N1, a gate electrode of the fifth filter transistor M5 is connected with the second node N2, and a second electrode of the fifth filter transistor M5 is connected with the first power terminal to receive the first power voltage VGL. A first electrode of the sixth filter transistor M6 is connected with the third node N3, a gate electrode of the sixth filter transistor M6 is connected with the second node N2, and a second electrode of the sixth filter transistor M6 is connected with the second power terminal to receive the second power voltage VGH. A first electrode of the seventh filter transistor M7 is connected with the second power terminal to receive the second power voltage VGH, a gate electrode of the seventh filter transistor M7 is connected with the second node N2, and a second electrode of the seventh filter transistor M7 is connected with a fourth node N4. A first electrode of the eighth filter transistor M8 is connected with the fourth node N4, a gate electrode of the eighth filter transistor M8 is connected with the second node N2, and a second electrode of the eighth filter transistor M8 is connected with the second pull-down node PD2. A first electrode of the ninth filter transistor M9 is connected with the second pull-down node PD2, a gate electrode of the ninth filter transistor M9 is connected with the second node N2, and a second electrode of the ninth filter transistor M9 is connected with a fifth node N5. A first electrode of the tenth filter transistor M10 is connected with the fifth node N5, a gate electrode of the tenth filter transistor M10 is connected with the second node N2, and a second electrode of the tenth filter transistor M10 is connected with the first power terminal to receive the first power voltage VGL. A first electrode of the eleventh filter transistor M11 is connected with the fourth node N4, a gate electrode of the eleventh filter transistor M11 is connected with the second pull-down node PD2, and a second electrode of the eleventh filter transistor M11 is connected with the first power terminal to receive the first power voltage VGL. A first electrode of the twelfth filter transistor M12 is connected with the fifth node N5, a gate electrode of the twelfth filter transistor M12 is connected with the second pull-down node PD2, and a second electrode of the twelfth filter transistor M12 is connected with the second voltage terminal to receive the second power voltage VGH.

Figure 4:
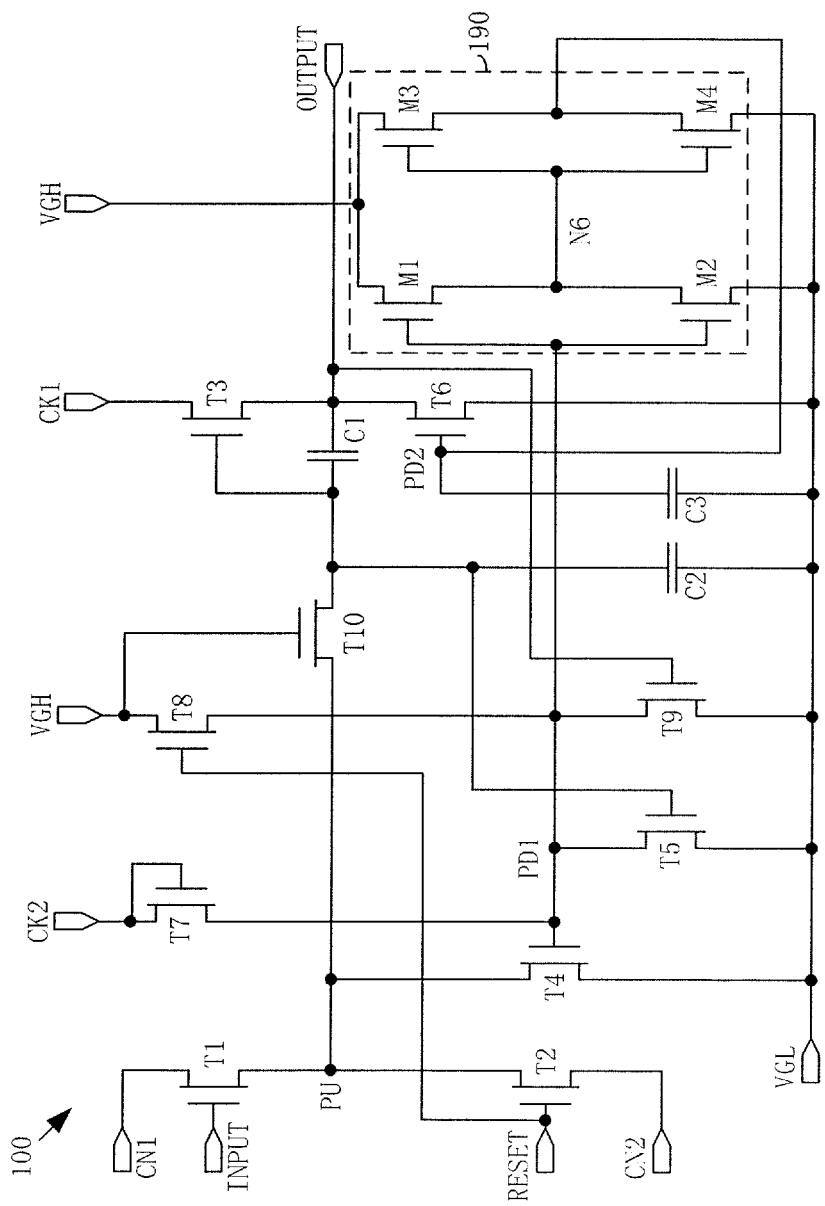
FIG. 4 is a fourth schematic diagram of a shift register provided by an embodiment of the present disclosure.

For example, in another example, as shown in FIG. 4, the filter circuit 190 comprises a first filter transistor M1, a second filter transistor M2, a third filter transistor M3, and a fourth filter transistor M4. The first filter transistor M1 and the third filter transistor M3 are P-type transistors, and the second filter transistor M2 and the fourth filter transistor M4 are N-type transistors. A first electrode of the first filter transistor M1 is connected with the second power terminal to receive the second power voltage VGH, a gate electrode of the first filter transistor M1 is connected with the first pull-down node PD1, and a second electrode of the first filter transistor M1 is connected with a sixth node N6. A first electrode of the second filter transistor M2 is connected with the sixth node N6, a gate electrode of the second filter transistor M2 is connected with the first pull-down node PD1, and a second electrode of the second filter transistor M2 is connected with the first power terminal to receive the first power voltage VGL. A first electrode of the third filter transistor M3 is connected with the second power terminal to receive the second power voltage VGH, a gate electrode of the third filter transistor M3 is connected with the sixth node N6, and a second electrode of the third filter transistor M3 is connected with the second pull-down node PD2. A first electrode of the fourth filter transistor M4 is connected with the second pull-down node PD2, a gate electrode of the fourth filter transistor M4 is connected with the sixth node N6, and a second electrode of the fourth filter transistor M4 is connected with the first power terminal to receive the first power voltage VGL.

For example, the filter circuits 190 shown in FIG. 3 and FIG. 4 can filter the voltage of the first pull-down node PD1 and transmit the filtered voltage to the second pull-down node PD2. Setting the filter circuit can make the voltage of the second pull-down node PD2 more stable and smooth, reduce the noise of the shift register, and improve the stability of the shift register.

It should be noted that, the filter circuits shown in FIG. 3 and FIG. 4 are merely exemplary implementations, and the filter circuit provided by the embodiments of the present disclosure comprises, but is not limited to, the filter circuit shown in FIG. 3 or FIG. 4.

Figure 5:
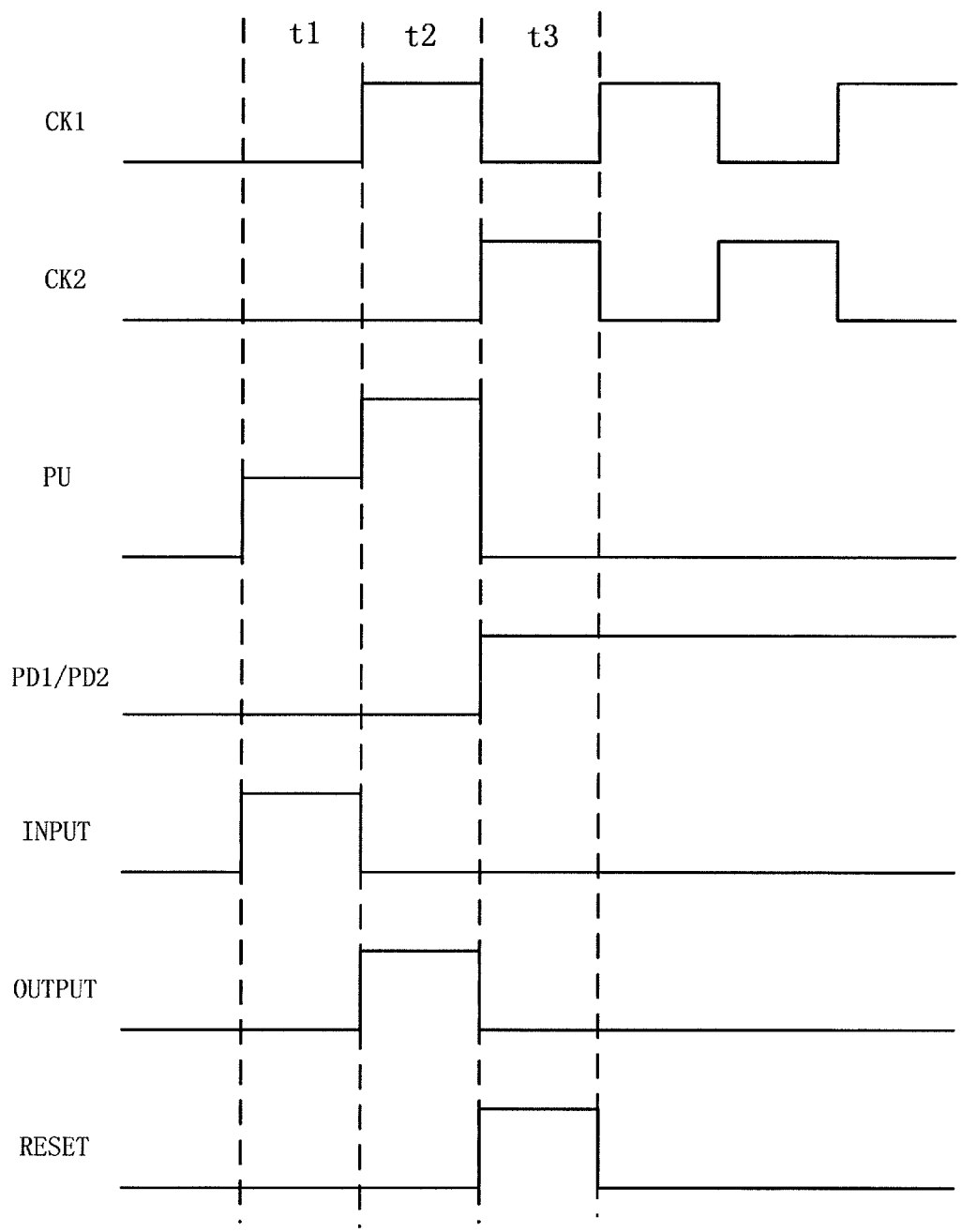
FIG. 5 is a driving timing diagram of a shift register provided by an embodiment of the present disclosure.

For example, FIG. 5 is a driving timing diagram of a shift register provided by an embodiment of the present disclosure. In the following, the shift register 100 shown in FIG. 3 or FIG. 4 and the driving timing shown in FIG. 5 are taken as examples to describe the working principle of the shift register provided by embodiments of the present disclosure. For example, the shift register 100 provided by an embodiment of the present disclosure can achieve forward scanning and backward scanning, that is, the function of the input circuit 115 and the function of the reset circuit 120 can be exchanged with each other. In the following, the forward scanning is taken as an example to describe the present disclosure. For example, in the forward scanning, the first input signal CN1 is a high level voltage, and the second input signal CN2 is a low level voltage; and in the backward scanning, the first input signal CN1 is a low level voltage, and the second input signal CN2 is a high level voltage.

For example, as shown in FIG. 5, at a first period t1, the first clock signal CK1 is a low level voltage, the second clock signal CK2 is a low level voltage, the input control signal INPUT is a high level voltage, and the reset control signal RESET is a low level voltage. Because the input control signal INPUT is a high level voltage, the first transistor T1 is turned on, the voltage of the pull-up node PU becomes a first high-level voltage (the first high-level voltage is a voltage of a high-level first input signal CN1), the first capacitor C1 and the second capacitor C2 are charged, the fifth transistor T5 is turned on, and the voltage of the first pull-down node PD1 is a low-level first power voltage VGL. Correspondingly, the voltage of the first pull-down node PD1 which is filtered by the filter circuit 190 is transmitted to the second pull-down node PD2, and therefore, the voltage of the second pull-down node PD2 is also a low level voltage.

For example, as shown in FIG. 5, at a second period t2, the first clock signal CK1 is a high level voltage, the second clock signal CK2 is a low level voltage, the input control signal INPUT is a low level voltage, and the reset control signal RESET is a low level voltage. Due to the bootstrap effect of the first capacitor C1, when the first clock signal CK1 becomes a high level voltage, the voltage of the pull-up node PU becomes a second high-level voltage. For example, the second high-level voltage is a sum of the voltage of the high-level first input signal CN1 and the high-level first clock signal CK1. The second high-level voltage is greater than the first high-level voltage, so that the third transistor T3 is turned on more sufficiently, the third transistor T3 transmits the voltage of the high-level first clock signal CK1 to the output terminal OUTPUT, and the ninth transistor T9 is turned on to write the low-level first power voltage VGL into the first pull-down node PD1.

For example, as shown in FIG. 5, at a third period t3, the first clock signal CK1 is a low level voltage, the second clock signal CK2 is a high level voltage, the input control signal INPUT is a low level voltage, and the reset control signal RESET is a high level voltage. Because the second clock signal CK2 is a high level voltage, the seventh transistor T7 is turned on to write the high-level second clock signal CK2 into the first pull-down node PD1. Because the reset control signal RESET is a high level voltage, the eighth transistor T8 is turned on to write the high-level second power voltage VGH into the first pull-down node PD1. For example, the voltage of the high-level second clock signal CK2 is equal to the second power voltage VGH. Because the voltage of the first pull-down node PD1 is a high level voltage, the fourth transistor T4 is turned on to write the low-level first power voltage VGL into the pull-up node PU. Correspondingly, the voltage of the first pull-down node PD1 which is filtered by the filter circuit 190 is transmitted to the second pull-down node PD2, and therefore, the voltage of the second pull-down node PD2 is also a high level voltage. Because the voltage of the second pull-down node PD2 is a high level voltage, the third capacitor C3 is charged, the sixth transistor T6 is turned on to write the low-level first power voltage VGL into the output terminal OUTPUT, and the voltage of the output terminal OUTPUT becomes a low level voltage.

An operation process of the filter circuit 190 is described below in conjunction with the filter circuit 190 shown in FIG. 3. The first filter transistor M1, the second filter transistor M2, the fifth filter transistor M5, the seventh filter transistor M7, the eighth filter transistor M8, and the eleventh filter transistor M11 all are P-type transistors; and the third filter transistor M3, the fourth filter transistor M4, the sixth filter transistor M6, the ninth filter transistor M9, the tenth filter transistor M10, and the twelfth filter transistor M12 all are N-type transistors. Therefore, when the voltage of the first pull-down node PD1 is a high level voltage (such as the high-level second power voltage VGH), the third filter transistor M3 and the fourth filter transistor M4 are turned on, the second node N2 is at a low level voltage, and the seventh filter transistor M7 and the eighth filter transistor M8 are turned on, so as to write the high-level second power voltage VGH into the second pull-down node PD2. That is, the filter circuit filters the voltage (VGH) of the high-level first pull-down node PD1 and transmits the filtered voltage to the second pull-down node PD2. When the voltage of the first pull-down node PD1 is a low level voltage (such as the low-level first power voltage VGL), the first filter transistor M1 and the second filter transistor M2 are turned on, the second node N2 is at a high level voltage, the ninth filter transistor M9 and the tenth filter transistor M10 are turned on, so as to write the low-level first power voltage VGL into the second pull-down node PD2. That is, the filter circuit filters the voltage (VGL) of the low-level first pull-down node PD1 and transmits the filtered voltage to the second pull-down node PD2.

An operation process of the filter circuit 190 is described below in conjunction with the filter circuit 190 shown in FIG. 4. The first filter transistor M1 and the third filter transistor M3 are P-type transistors, and the second filter transistor M2 and the fourth filter transistor M4 are N-type transistors. Therefore, when the voltage of the first pull-down node PD1 is a high level voltage (such as the high-level second power voltage VGH), the second filter transistor M2 is turned on, a voltage of the sixth node N6 is a low level voltage, the third filter transistor M3 is turned on to write the high-level second power voltage VGH into the second pull-down node PD2. That is, the filter circuit filters the voltage (VGH) of the high-level first pull-down node PD1 and transmits the filtered voltage to the second pull-down node PD2. When the voltage of the first pull-down node PD1 is a low level voltage (such as the low-level first power voltage VGL), the first filter transistor M1 is turned on, the voltage of the sixth transistor T6 is a high level voltage, the fourth filter transistor M4 is turned on to write the low-level first power voltage VGL into the second pull-down node PD2. That is, the filter circuit filters the voltage (VGL) of the low-level first pull-down node PD1 and transmits the filtered voltage to the second pull-down node PD2.

Figure 6:
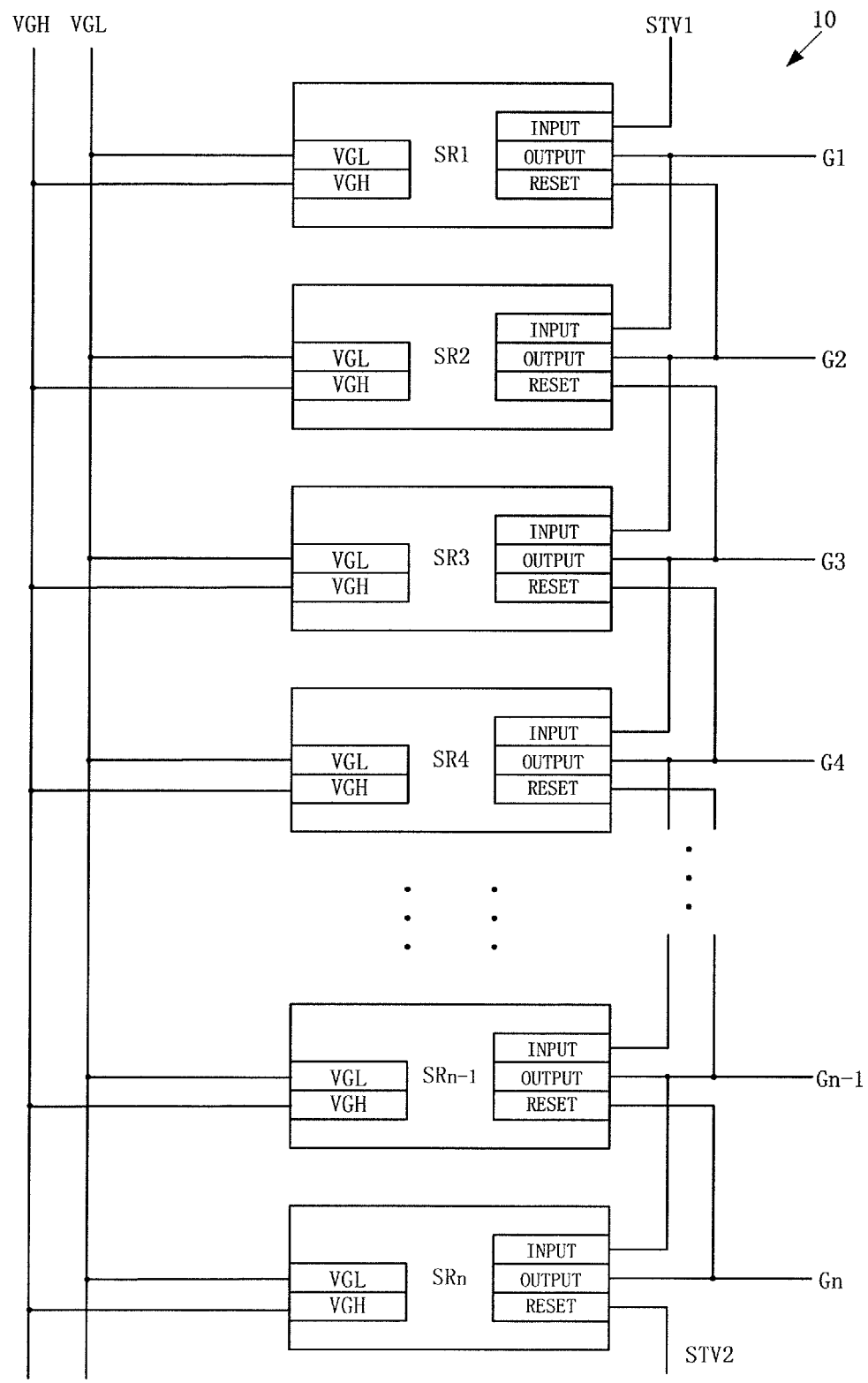
FIG. 6 is a schematic diagram of a gate driving circuit provided by an embodiment of the present disclosure.

An embodiment of the present disclosure further provides a gate driving circuit 10. As shown in FIG. 6, the gate driving circuit 10 comprises the shift register 100 provided by any one embodiment of the present disclosure.

For example, the gate driving circuit 10 provided by an embodiment of the present disclosure comprises a plurality of cascaded shift registers 100 provided by any one embodiment of the present disclosure. Except for a first-stage shift register 100 and a last-stage shift register 100, an input control terminal (which is configured to provide an input control signal INPUT) of a present-stage shift register 100 is connected with an output terminal OUTPUT of a previous-stage shift register 100; and a reset control terminal (which is configured to provide a reset control signal RESET) of the present-stage shift register 100 is connected with an output terminal OUTPUT of a next-stage shift register 100.

For example, an input terminal of the first-stage shift register is connected with a first trigger signal terminal to receive a first trigger signal STV1; and a reset signal terminal of the last-stage shift register is connected with a second trigger signal terminal to receive a second trigger signal STV2.

For example, when the gate driving circuit 10 performs forward scanning, the first trigger signal STV1 is used as an input signal of the first-stage shift register, and the second trigger signal terminal STV2 is used as a reset signal of the last-stage shift register. When the gate driving circuit 10 performs backward scanning, the second trigger signal terminal STV2 is used as an input signal of the last-stage shift register, and the first trigger signal terminal STV1 is used as a reset signal of the first-stage shift register. For example, functions of the input circuit and the reset circuit of the shift register are interchanged when switching between the forward scanning and the backward scanning.

For example, as shown in FIG. 6, the gate driving circuit 10 comprises shift registers SR1, SR2, . . . , SRn with n stages. Each of the shift registers SR1, . . . , SR2, SRn may be the shift register 100 provided by any one embodiment of the present disclosure. Output terminals OUTPUT of the shift registers SR1, SR2, . . . , SRn are respectively connected with gate lines G1, G2, . . . , Gn.

It should be noted that, the gate diving circuit 10 provided by the embodiments of the present disclosure can achieve the forward scanning and the backward scanning. When a scanning direction is switched, a "previous stage" and a "next stage" in the time sequence change correspondingly. Therefore, the above "previous stage" and "next stage" do not refer to the previous stage and the next stage in the scanning sequence, but refer to the previous stage and the next stage in the physical connection.

Figure 7:
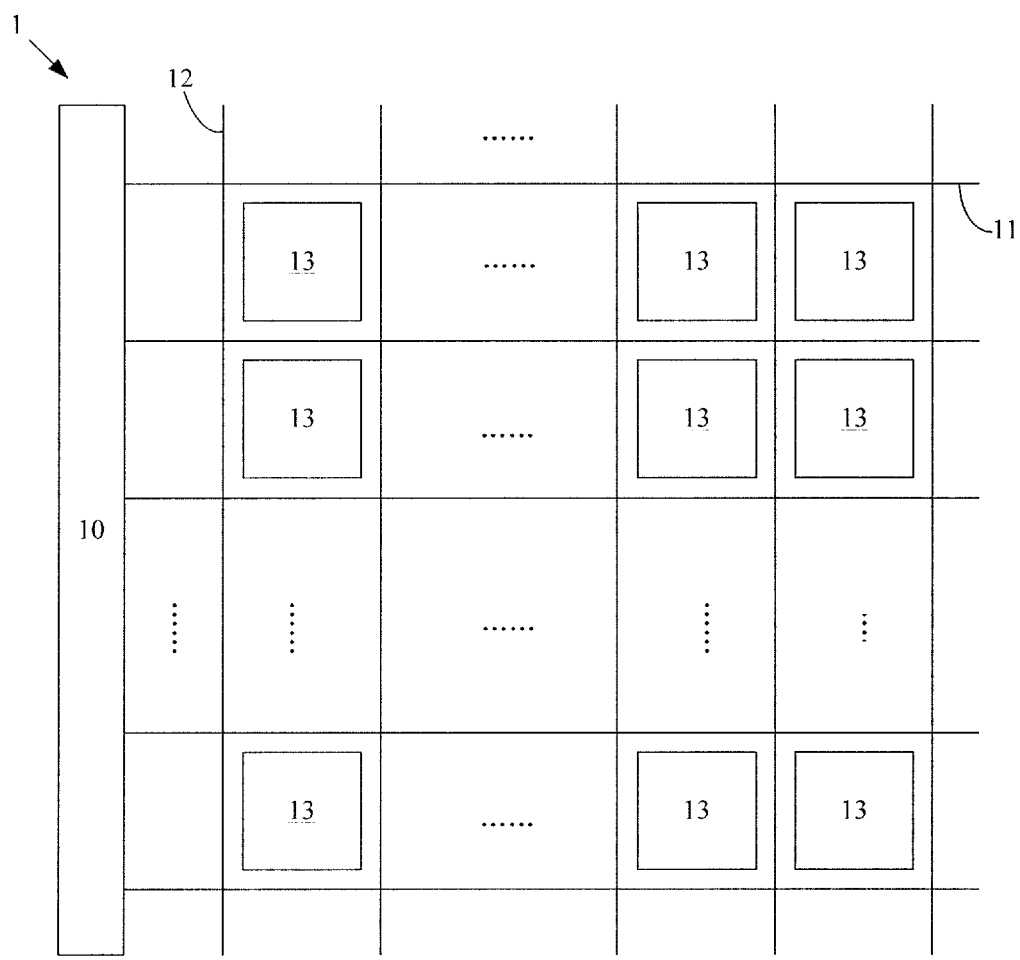
FIG. 7 is a schematic diagram of a display panel provided by an embodiment of the present disclosure.

An embodiment of the present disclosure further provides a display panel 1. As shown in FIG. 7, the display panel 1 comprises the gate driving circuit 10 provided by any one embodiment of the present disclosure.

For example, as shown in FIG. 7, the display panel 1 provided by the embodiments of the present disclosure further comprises gate lines 11, data lines 12 and a plurality of pixel units 13 defined by intercrossing of the gate lines 11 and the data lines 12, and the gate driving circuit 10 is configured to provide gate driving signals to the gate lines 11.

For example, the gate lines 11 may comprise gate lines G1, G2, . . . , Gn shown in FIG. 6, and a shift register in each stage from the shift registers SR1, SR2, . . . , SRn is configured to output a gate driving signal to a corresponding gate line in the gate lines G1, G2, . . . , Gn.

Figure 8:
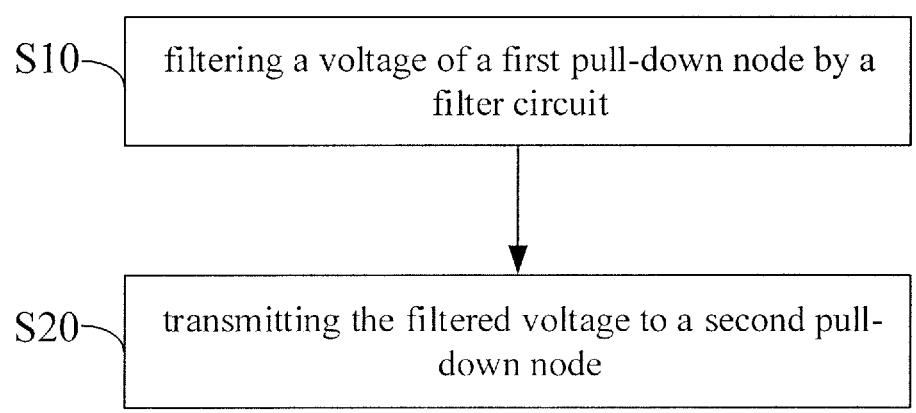
FIG. 8 is a flow chart of a driving method of a shift register provided by an embodiment of the present disclosure.

An embodiment of the present disclosure further provides a driving method of a shift register provided by any one embodiment of the present disclosure. As shown in FIG. 8, the driving method comprises the following steps:

Step S10: filtering a voltage of a first pull-down node by a filter circuit; and Step S20: transmitting the filtered voltage to a second pull-down node.

For example, filtering in the embodiments of the present disclosure refers to operations including shaping a certain voltage, and eliminating noise or clutters, so as to keep the voltage accurate and stable.

The shift register, the gate driving circuit, the display panel and the driving method provided by the embodiments of the present disclosure can reduce the noise of the shift register, and improve the stability of the shift register.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

The present application claims priority to Chinese patent application No. 201710135048.7, filed Mar. 8, 2017, the entire disclosure of which is incorporated herein by reference as part of the present application.

What is claimed is:

1. A shift register, comprising:
    an input circuit, connected with a pull-up node, and configured to write a first input signal into the pull-up node;
    an output circuit, connected with the pull-up node and an output terminal respectively, and configured to write a first clock signal into the output terminal;
    a pull-up node pull-down circuit, connected with the pull-up node, a first pull-down node, and a first power terminal respectively;
    a first pull-down circuit of the first pull-down node, connected with the first pull-down node, the pull-up node and the first power terminal respectively;
    an output pull-down circuit, connected with the output terminal, a second pull-down node and the first power terminal respectively;
    a pull-up circuit of the first pull-down node, configured to pull up a voltage of the first pull-down node in response to at least one of a second clock signal and a reset control signal; and
    a filter circuit, connected with the first pull-down node, the second pull-down node, the first power terminal and a second power terminal respectively, and configured to filter the voltage of the first pull-down node and transmit the filtered voltage to the second pull-down node.

2. The shift register according to claim 1, further comprising:
    a reset circuit, connected with the pull-up node, and configured to write a second input signal into the pull-up node; and
    a first storage circuit, connected with the pull-up node and the output terminal respectively.

3. The shift register according to claim 2, wherein:
    the input circuit comprises a first transistor, a first electrode of the first transistor is connected with a first input signal terminal to receive the first input signal, a gate electrode of the first transistor is connected with an input control terminal to receive an input control signal, and a second electrode of the first transistor is connected with the pull-up node;
    the reset circuit comprises a second transistor, a first electrode of the second transistor is connected with a second input signal terminal to receive the second input signal, a gate electrode of the second transistor is connected with a reset control terminal to receive the reset control signal, and a second electrode of the second transistor is connected with the pull-up node;
    the output circuit comprises a third transistor, a first electrode of the third transistor is connected with a first clock signal terminal to receive the first clock signal, a gate electrode of the third transistor is connected with the pull-up node, a second electrode of the third transistor is connected with the output terminal; and
    the first storage circuit comprises a first capacitor, a first terminal of the first capacitor is connected with the pull-up node, and a second terminal of the first capacitor is connected with the output terminal.

4. The shift register according to claim 3, wherein the filter circuit comprises a first filter transistor, a second filter transistor, a third filter transistor, a fourth filter transistor, a fifth filter transistor, a sixth filter transistor, a seventh filter transistor, an eighth filter transistor, a ninth filter transistor, a tenth filter transistor, an eleventh filter transistor, and a twelfth filter transistor,
    the first filter transistor, the second filter transistor, the fifth filter transistor, the seventh filter transistor, the eighth filter transistor, and the eleventh filter transistor all are P-type transistors, the third filter transistor, the fourth filter transistor, the sixth filter transistor, the ninth filter transistor, the tenth filter transistor, and the twelfth filter transistor all are N-type transistors, a first electrode of the first filter transistor is connected with the second power terminal to receive a second power voltage, a gate electrode of the first filter transistor is connected with the first pull-down node, and a second electrode of the first filter transistor is connected with a first node, a first electrode of the second filter transistor is connected with the first node, a gate electrode of the second filter transistor is connected with the first pull-down node, and a second electrode of the second filter transistor is connected with a second node, a first electrode of the third filter transistor is connected with the second node, a gate electrode of the third filter transistor is connected with the first pull-down node, and a second electrode of the third filter transistor is connected with a third node, a first electrode of the fourth filter transistor is connected with the third node, a gate electrode of the fourth filter transistor is connected with the first pull-down node, and a second electrode of the fourth filter transistor is connected with the first power terminal to receive a first power voltage, a first electrode of the fifth filter transistor is connected with the first node, a gate electrode of the fifth filter transistor is connected with the second node, and a second electrode of the fifth filter transistor is connected with the first power terminal to receive the first power voltage, a first electrode of the sixth filter transistor is connected with the third node, a gate electrode of the sixth filter transistor is connected with the second node, and a second electrode of the sixth filter transistor is connected with the second power terminal to receive the second power voltage, a first electrode of the seventh filter transistor is connected with the second power terminal to receive the second power voltage, a gate electrode of the seventh filter transistor is connected with the second node, and a second electrode of the seventh filter transistor is connected with a fourth node, a first electrode of the eighth filter transistor is connected with the fourth node, a gate electrode of the eighth filter transistor is connected with the second node, and a second electrode of the eighth filter transistor is connected with the second pull-down node, a first electrode of the ninth filter transistor is connected with the second pull-down node, a gate electrode of the ninth filter transistor is connected with the second node, and a second electrode of the ninth filter transistor is connected with a fifth node, a first electrode of the tenth filter transistor is connected with the fifth node, a gate electrode of the tenth filter transistor is connected with the second node, and a second electrode of the tenth filter transistor is connected with the first power terminal to receive the first power voltage, a first electrode of the eleventh filter transistor is connected with the fourth node, a gate electrode of the eleventh filter transistor is connected with the second pull-down node, and a second electrode of the eleventh filter transistor is connected with the first power terminal to receive the first power voltage, and a first electrode of the twelfth filter transistor is connected with the fifth node, a gate electrode of the twelfth filter transistor is connected with the second pull-down node, and a second electrode of the twelfth filter transistor is connected with the second voltage terminal to receive the second power voltage.

5. The shift register according to claim 3, wherein the filter circuit comprises a first filter transistor, a second filter transistor, a third filter transistor, and a fourth filter transistor, the first filter transistor and the third filter transistor are P-type transistors, the second filter transistor and the fourth filter transistor are N-type transistors, a first electrode of the first filter transistor is connected with the second power terminal to receive a second power voltage, a gate electrode of the first filter transistor is connected with the first pull-down node, and a second electrode of the first filter transistor is connected with a sixth node, a first electrode of the second filter transistor is connected with the sixth node, a gate electrode of the second filter transistor is connected with the first pull-down node, and a second electrode of the second filter transistor is connected with the first power terminal to receive a first power voltage, a first electrode of the third filter transistor is connected with the second power terminal to receive the second power voltage, a gate electrode of the third filter transistor is connected with the sixth node, and a second electrode of the third filter transistor is connected with the second pull-down node, and a first electrode of the fourth filter transistor is connected with the second pull-down node, a gate electrode of the fourth filter transistor is connected with the sixth node, and a second electrode of the fourth filter transistor is connected with the first power terminal to receive the first power voltage.

6. The shift register according to claim 2, wherein the filter circuit comprises a first filter transistor, a second filter transistor, a third filter transistor, a fourth filter transistor, a fifth filter transistor, a sixth filter transistor, a seventh filter transistor, an eighth filter transistor, a ninth filter transistor, a tenth filter transistor, an eleventh filter transistor, and a twelfth filter transistor, the first filter transistor, the second filter transistor, the fifth filter transistor, the seventh filter transistor, the eighth filter transistor, and the eleventh filter transistor all are P-type transistors, the third filter transistor, the fourth filter transistor, the sixth filter transistor, the ninth filter transistor, the tenth filter transistor, and the twelfth filter transistor all are N-type transistors, a first electrode of the first filter transistor is connected with the second power terminal to receive a second power voltage, a gate electrode of the first filter transistor is connected with the first pull-down node, and a second electrode of the first filter transistor is connected with a first node, a first electrode of the second filter transistor is connected with the first node, a gate electrode of the second filter transistor is connected with the first pull-down node, and a second electrode of the second filter transistor is connected with a second node, a first electrode of the third filter transistor is connected with the second node, a gate electrode of the third filter transistor is connected with the first pull-down node, and a second electrode of the third filter transistor is connected with a third node, a first electrode of the fourth filter transistor is connected with the third node, a gate electrode of the fourth filter transistor is connected with the first pull-down node, and a second electrode of the fourth filter transistor is connected with the first power terminal to receive a first power voltage, a first electrode of the fifth filter transistor is connected with the first node, a gate electrode of the fifth filter transistor is connected with the second node, and a second electrode of the fifth filter transistor is connected with the first power terminal to receive the first power voltage, a first electrode of the sixth filter transistor is connected with the third node, a gate electrode of the sixth filter transistor is connected with the second node, and a second electrode of the sixth filter transistor is connected with the second power terminal to receive the second power voltage, a first electrode of the seventh filter transistor is connected with the second power terminal to receive the second power voltage, a gate electrode of the seventh filter transistor is connected with the second node, and a second electrode of the seventh filter transistor is connected with a fourth node, a first electrode of the eighth filter transistor is connected with the fourth node, a gate electrode of the eighth filter transistor is connected with the second node, and a second electrode of the eighth filter transistor is connected with the second pull-down node, a first electrode of the ninth filter transistor is connected with the second pull-down node, a gate electrode of the ninth filter transistor is connected with the second node, and a second electrode of the ninth filter transistor is connected with a fifth node, a first electrode of the tenth filter transistor is connected with the fifth node, a gate electrode of the tenth filter transistor is connected with the second node, and a second electrode of the tenth filter transistor is connected with the first power terminal to receive the first power voltage, a first electrode of the eleventh filter transistor is connected with the fourth node, a gate electrode of the eleventh filter transistor is connected with the second pull-down node, and a second electrode of the eleventh filter transistor is connected with the first power terminal to receive the first power voltage, and a first electrode of the twelfth filter transistor is connected with the fifth node, a gate electrode of the twelfth filter transistor is connected with the second pull-down node, and a second electrode of the twelfth filter transistor is connected with the second voltage terminal to receive the second power voltage.

7. The shift register according to claim 2, wherein the filter circuit comprises a first filter transistor, a second filter transistor, a third filter transistor, and a fourth filter transistor, the first filter transistor and the third filter transistor are P-type transistors, the second filter transistor and the fourth filter transistor are N-type transistors, a first electrode of the first filter transistor is connected with the second power terminal to receive a second power voltage, a gate electrode of the first filter transistor is connected with the first pull-down node, and a second electrode of the first filter transistor is connected with a sixth node, a first electrode of the second filter transistor is connected with the sixth node, a gate electrode of the second filter transistor is connected with the first pull-down node, and a second electrode of the second filter transistor is connected with the first power terminal to receive a first power voltage, a first electrode of the third filter transistor is connected with the second power terminal to receive the second power voltage, a gate electrode of the third filter transistor is connected with the sixth node, and a second electrode of the third filter transistor is connected with the second pull-down node, and a first electrode of the fourth filter transistor is connected with the second pull-down node, a gate electrode of the fourth filter transistor is connected with the sixth node, and a second electrode of the fourth filter transistor is connected with the first power terminal to receive the first power voltage.

8. The shift register according to claim 1, wherein the pull-up node pull-down circuit comprises a fourth transistor, a first electrode of the fourth transistor is connected with the pull-up node, a gate electrode of the fourth transistor is connected with the first pull-down node, and a second electrode of the fourth transistor is connected with the first power terminal to receive a first power voltage.

9. The shift register according to claim 1, wherein the first pull-down circuit of the first pull-down node comprises a fifth transistor, a first electrode of the fifth transistor is connected with the first pull-down node, a gate electrode of the fifth transistor is connected with the pull-up node, and a second electrode of the fifth transistor is connected with the first power terminal to receive a first power voltage.

10. The shift register according to claim 1, wherein the output pull-down circuit comprises a sixth transistor, a first electrode of the sixth transistor is connected with the output terminal, a gate electrode of the sixth transistor is connected with the second pull-down node, and a second electrode of the sixth transistor is connected with the first power terminal to receive a first power voltage.

11. The shift register according to claim 1, wherein the pull-up circuit of the first pull-down node comprises:

a seventh transistor and an eighth transistor, a first electrode of the seventh transistor is connected with a second clock signal terminal to receive the second clock signal, a gate electrode of the seventh transistor is connected with the second clock signal terminal to receive the second clock signal, and a second electrode of the seventh transistor is connected with the first pull-down node, and a first electrode of the eighth transistor is connected with the second power terminal to receive a second power voltage, a gate electrode of the eighth transistor is connected with a reset control terminal to receive the reset control signal, and a second electrode of the eighth transistor is connected with the first pull-down node.

12. The shift register according to claim 1, further comprising a second pull-down circuit of the first pull-down node, wherein the second pull-down circuit of the first pull-down node comprises a ninth transistor, a first electrode of the ninth transistor is connected with the first pull-down node, a gate electrode of the ninth transistor is connected with the output terminal, and a second electrode of the ninth transistor is connected with the first power terminal to receive a first power voltage.

13. The shift register according to claim 1, further comprising a tenth transistor, wherein a first electrode of the tenth transistor is connected with the input circuit, the reset circuit and the pull-up node pull-down circuit respectively, a gate electrode of the tenth transistor is connected with the second power terminal to receive a second power voltage, and a second electrode of the tenth transistor is connected with a first storage circuit, the output circuit and the first pull-down circuit of the first pull-down node respectively.

14. The shift register according to claim 1, further comprising a second storage circuit and a third storage circuit, wherein:
   the second storage circuit is connected with the pull-up node and the first power terminal respectively, and is configured to maintain a voltage difference between the pull-up node and the first power terminal,
   the third storage circuit is connected with the second pull-down node and the first power terminal respectively, and is configured to maintain a voltage difference between the second pull-down node and the first power terminal,
   the second storage circuit comprises a second capacitor, a first terminal of the second capacitor is connected with the pull-up node, and a second terminal of the second capacitor is connected with the first power terminal, and
   the third storage circuit comprises a third capacitor, a first terminal of the third capacitor is connected with the second pull-down node, and a second terminal of the third capacitor is connected with the first power terminal.

15. The shift register according to claim 1, wherein the filter circuit comprises a first filter transistor, a second filter transistor, a third filter transistor, a fourth filter transistor, a fifth filter transistor, a sixth filter transistor, a seventh filter transistor, an eighth filter transistor, a ninth filter transistor, a tenth filter transistor, an eleventh filter transistor, and a twelfth filter transistor,
   the first filter transistor, the second filter transistor, the fifth filter transistor, the seventh filter transistor, the eighth filter transistor, and the eleventh filter transistor all are P-type transistors,
   the third filter transistor, the fourth filter transistor, the sixth filter transistor, the ninth filter transistor, the tenth filter transistor, and the twelfth filter transistor all are N-type transistors,
   a first electrode of the first filter transistor is connected with the second power terminal to receive a second power voltage, a gate electrode of the first filter transistor is connected with the first pull-down node, and a second electrode of the first filter transistor is connected with a first node,
   a first electrode of the second filter transistor is connected with the first node, a gate electrode of the second filter transistor is connected with the first pull-down node, and a second electrode of the second filter transistor is connected with a second node,
   a first electrode of the third filter transistor is connected with the second node, a gate electrode of the third filter transistor is connected with the first pull-down node, and a second electrode of the third filter transistor is connected with a third node,
   a first electrode of the fourth filter transistor is connected with the third node, a gate electrode of the fourth filter transistor is connected with the first pull-down node, and a second electrode of the fourth filter transistor is connected with the first power terminal to receive a first power voltage,
   a first electrode of the fifth filter transistor is connected with the first node, a gate electrode of the fifth filter transistor is connected with the second node, and a second electrode of the fifth filter transistor is connected with the first power terminal to receive the first power voltage,
   a first electrode of the sixth filter transistor is connected with the third node, a gate electrode of the sixth filter transistor is connected with the second node, and a second electrode of the sixth filter transistor is connected with the second power terminal to receive the second power voltage,
   a first electrode of the seventh filter transistor is connected with the second power terminal to receive the second power voltage, a gate electrode of the seventh filter transistor is connected with the second node, and a second electrode of the seventh filter transistor is connected with a fourth node,
   a first electrode of the eighth filter transistor is connected with the fourth node, a gate electrode of the eighth filter transistor is connected with the second node, and a second electrode of the eighth filter transistor is connected with the second pull-down node,
   a first electrode of the ninth filter transistor is connected with the second pull-down node, a gate electrode of the ninth filter transistor is connected with the second node, and a second electrode of the ninth filter transistor is connected with a fifth node,
   a first electrode of the tenth filter transistor is connected with the fifth node, a gate electrode of the tenth filter transistor is connected with the second node, and a second electrode of the tenth filter transistor is connected with the first power terminal to receive the first power voltage,
   a first electrode of the eleventh filter transistor is connected with the fourth node, a gate electrode of the eleventh filter transistor is connected with the second pull-down node, and a second electrode of the eleventh filter transistor is connected with the first power terminal to receive the first power voltage, and
   a first electrode of the twelfth filter transistor is connected with the fifth node, a gate electrode of the twelfth filter transistor is connected with the second pull-down node, and a second electrode of the twelfth filter transistor is connected with the second voltage terminal to receive the second power voltage.

16. The shift register according to claim 1, wherein the filter circuit comprises a first filter transistor, a second filter transistor, a third filter transistor, and a fourth filter transistor,
   the first filter transistor and the third filter transistor are P-type transistors, the second filter transistor and the fourth filter transistor are N-type transistors,
   a first electrode of the first filter transistor is connected with the second power terminal to receive a second power voltage, a gate electrode of the first filter transistor is connected with the first pull-down node, and a second electrode of the first filter transistor is connected with a sixth node,
   a first electrode of the second filter transistor is connected with the sixth node, a gate electrode of the second filter transistor is connected with the first pull-down node, and a second electrode of the second filter transistor is connected with the first power terminal to receive a first power voltage,
   a first electrode of the third filter transistor is connected with the second power terminal to receive the second power voltage, a gate electrode of the third filter transistor is connected with the sixth node, and a second electrode of the third filter transistor is connected with the second pull-down node, and a first electrode of the fourth filter transistor is connected with the second pull-down node, a gate electrode of the fourth filter transistor is connected with the sixth node, and a second electrode of the fourth filter transistor is connected with the first power terminal to receive the first power voltage.

17. A gate driving circuit, comprising the shift register according to claim 1.

18. The gate driving circuit according to claim 17, further comprising a plurality of cascaded shift registers, wherein except for a first-stage shift register and a last-stage shift register, an input control terminal of a present-stage shift register is connected with an output terminal of a previous-stage shift register, and a reset control terminal of the present-stage shift register is connected with an output terminal of a next-stage shift register.

19. A display panel, comprising the gate driving circuit according to claim 17.

20. A driving method of the shift register according to claim 1, comprising:

filtering a voltage of a first pull-down node by a filter circuit; and transmitting the filtered voltage to a second pull-down node.

* * * * *